US 6,736,636 B2

(12) United States Patent  (10) Patent No.: US 6,736,636 B2
Saito  (45) Date of Patent: May 18, 2004

(54) THERMAL PROCESSOR WITH GAS SUPPLY

(75) Inventor: Yukimasa Saito, Shiroyama-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/882,255

(22) Filed: Jun. 18, 2001

(65) Prior Publication Data
US 2001/0054386 A1 Dec. 27, 2001

(30) Foreign Application Priority Data
Jun. 20, 2000 (JP) ....................................... 2000-184310

(51) Int. Cl.[7] .................................................. F27D 3/16
(52) U.S. Cl. ........................ 432/239; 432/253; 137/590
(58) Field of Search ............................... 432/239, 241, 432/247, 253; 118/715, 724, 725; 34/443; 137/590

(56) References Cited

U.S. PATENT DOCUMENTS

| 4,376,451 A | * | 3/1983 | Bouron et al. ............... 137/588 |
| 5,207,573 A | * | 5/1993 | Miyagi et al. ............... 432/253 |
| 5,330,352 A | * | 7/1994 | Watanabe et al. ............ 432/253 |
| 5,588,827 A | * | 12/1996 | Muka .......................... 432/253 |
| 5,632,820 A | * | 5/1997 | Taniyama et al. ............ 432/241 |
| 5,662,470 A | * | 9/1997 | Huussen et al. ............. 432/241 |
| 5,709,543 A | * | 1/1998 | Shimazu ...................... 432/253 |
| 6,235,121 B1 | * | 5/2001 | Honma et al. ............... 432/253 |
| 6,369,361 B2 | * | 4/2002 | Saito et al. .................. 219/390 |

FOREIGN PATENT DOCUMENTS

| JP | 63-5626 | 1/1988 |
| JP | 1-241819 | 9/1989 |
| JP | 7-94435 | 4/1995 |

* cited by examiner

Primary Examiner—Gregory Wilson
(74) Attorney, Agent, or Firm—Smith, Gambrell & Russell, LLP

(57) ABSTRACT

A thermal processing unit of the invention includes a processing container that can contain an object to be processed therein, the processing container having a lower end provided with an opening. The opening is opened and closed by a lid. A flange is provided at a peripheral portion of the opening, and a gas-supplying unit is provided at the flange for supplying a gas into the processing container. A heating mechanism can heat the object to be processed contained in the processing container.

14 Claims, 2 Drawing Sheets

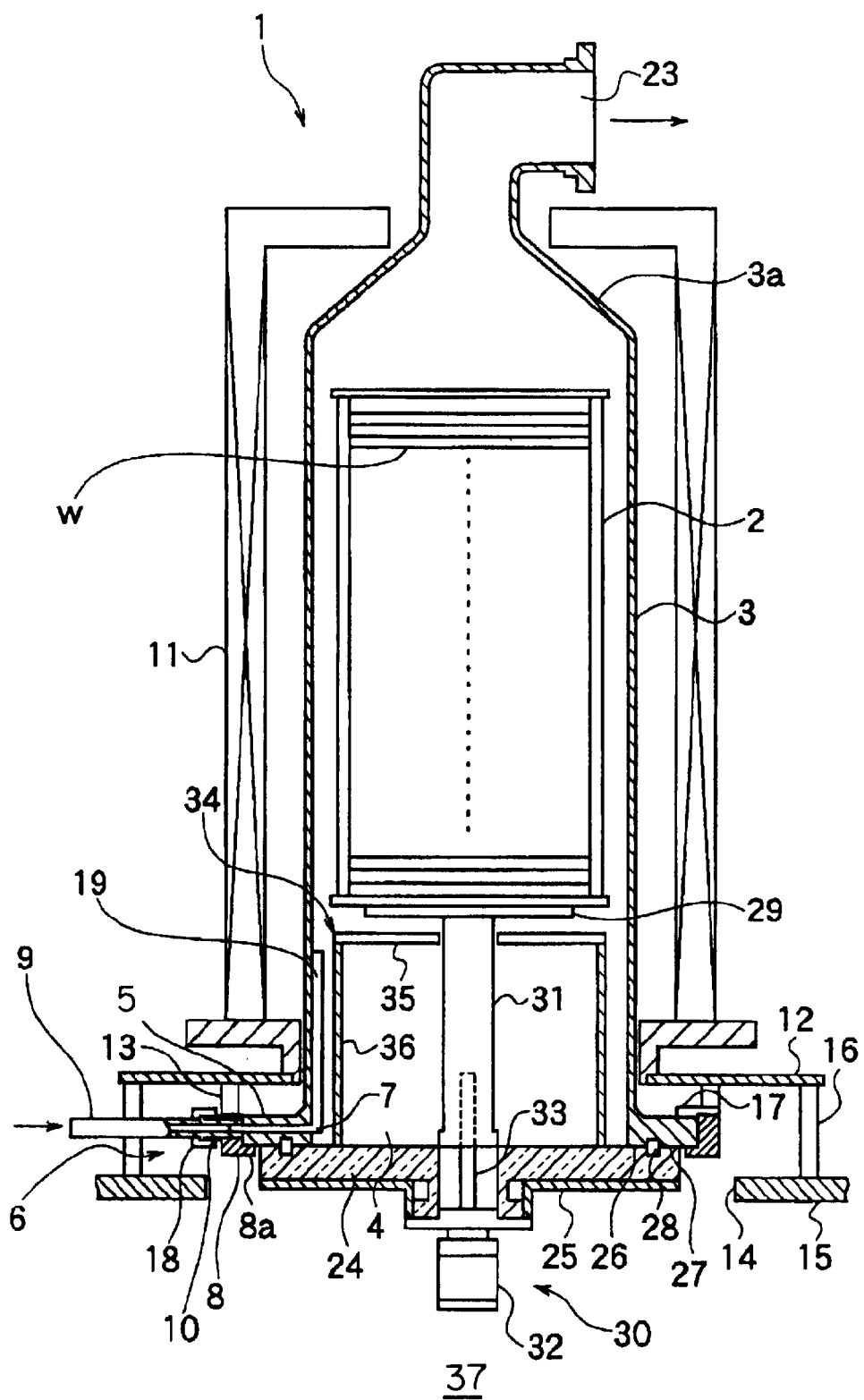
F I G. 1

THERMAL PROCESSOR WITH GAS SUPPLY

BACKGROUND OF THE INVENTION

1. Field of the Invention

This invention relates to a thermal processing unit that can conduct a thermal process to an object to be processed.

2. Disclosure of the Prior Art

In manufacturing semiconductor devices, various types of thermal processing units are used for conducting a process such as oxidation, diffusion or CVD (Chemical Vapor Deposition) to an object to be processed such as a wafer. As one of them, a vertical thermal processing unit is known, which can conduct a thermal process to a large number of objects to be processed at a time. The vertical thermal processing unit has a vertical cylindrical processing container made of crystal. An upper end of the processing container is closed, but a lower end of the processing container is open as a furnace opening. A flange is provided at a peripheral portion of the furnace opening. A heater is disposed to surround the processing container.

If the unit is designed for a diffusion process, it should be considered that a process temperature is high. That is, taking a heat-resistance property into consideration, a gas-supplying unit (a gas-supplying port) consisting of a crystal tube is provided at a lower side portion of the processing unit (higher than the flange) in order to introduce a gas such as a process gas into the processing unit.

If the unit is designed for a CVD process, a manifold made of a metal is joined to the lower open end of the processing unit. In addition, a gas-supplying unit consisting of a metal tube is provided at a side portion of the manifold.

The lower open end of the processing container or a lower open end of the manifold is adapted to be opened and hermetically closed by a lid. A holding tool (a holding boat), which can hold a large number of wafers, for example 150 wafers, in a vertical tier-like manner at a predetermined pitch, is placed on the lid via a thermal insulating cylinder that is a furnace-opening insulating means. A loading area is arranged under the processing container for loading and unloading the holding tool. An elevating mechanism is disposed in the loading area for loading and unloading the holding tool into and from the processing container by moving up and down the lid.

However, in the above vertical thermal processing unit, under the processing container, a space has to be secured for arranging the loading area and the elevating mechanism. In addition, at a lower side portion of the processing container, a space has to be secured for disposing the gas-supplying unit (or the manifold if the unit is designed for the CVD process). Thus, the unit has a greater height undesirably.

Especially, if the loading area is designed for a load-lock type, a structure for maintaining a vacuum needs more height. If the wafer-pitch is reduced because of restriction of the height of the unit, it may become difficult to obtain a film having a desired property.

If the unit is designed for a diffusion process, the gas-supplying unit (the gas-supplying port) consisting of the crystal tube is provided to project from the side portion of the processing unit. Thus, the gas-supplying unit may be easily damaged by an outer force or an impact, that is, it may be weak in strength.

If the unit is designed for a CVD process, the gas-supplying unit has no problems in strength because the manifold made of a metal is used. However, in the case, it is necessary to cool a sealing portion in order to prevent an O-ring as a sealing member from thermally deteriorating. In addition, it is necessary to prevent separation (deposition) of the process gas, which may be caused by the cooling of the sealing portion, by way of heating or the like. These result in a complex structure.

SUMMARY OF THE INVENTION

This invention is intended to solve the above problems effectively. An object of this invention is to provide a thermal processing unit wherein a height of the unit may be considerably reduced, strength of a gas-supplying unit may be enhanced, a structure of a processing container may be simplified, and process performance may be improved.

This invention is a thermal processing unit comprising: a processing container that can contain an object to be processed therein, the processing container having a lower end provided with an opening; a lid that can open and close the opening; a flange provided at a peripheral portion of the opening; a gas-supplying unit provided at the flange for supplying a gas into the processing container; and a heating mechanism that can heat the object to be processed contained in the processing container.

According to the feature, since the gas-supplying unit is provided at the flange itself, a height of the unit may be considerably reduced, strength of the gas-supplying unit may be enhanced, a structure of the processing container may be simplified and process performance of the unit may be improved.

Preferably, the gas-supplying unit has a gas-supplying hole that extends from an outer edge of the flange to an inside of the processing container.

For example, the processing container has a substantially cylindrical shape, the flange has a substantially circular shape, and the gas-supplying hole extends in a substantially radial direction of the flange.

Preferably, a gas-supplying tube is inserted through the gas-supplying hole to extend into the processing container. Thus, a process gas is efficiently supplied into the processing container. In the case, preferably, the flange is provided with a fixing mechanism that can fix the gas-supplying tube to the flange.

In addition, preferably, the gas-supplying tube is hermetically connected with a gas-supplying line. In the case, the gas-supplying line may be connected easily and desirably.

In addition, preferably, a circular supporting frame is provided at a peripheral area of the flange. In the case, strength of the flange and the gas-supplying unit may be enhanced. For example, the circular supporting frame is made of a metal.

Alternatively, preferably, a circular supporting frame is provided at a peripheral area of the flange, the circular supporting frame has a through hole that extends from an inter edge to an outer edge thereof, and the through hole is communicated with the gas-supplying hole. In the case too, for example, the circular supporting frame is made of a metal.

Alternatively, preferably, a circular supporting frame is provided at a peripheral area of the flange, the circular supporting frame has a through hole that extends from an inter edge to an outer edge thereof, and the gas-supplying tube passes through the through hole. In the case too, for example, the circular supporting frame is made of a metal. In the case, the circular supporting frame is preferably provided with a fixing mechanism that can fix the gas-supplying tube to the circular supporting frame.

BRIEF DESCRIPTION OF THE DRAWINGS

FIG. 1 is a schematic longitudinal sectional view of an embodiment of a vertical thermal processing unit according to the invention.

DESCRIPTION OF THE PREFERRED EMBODIMENT

Figure 2:
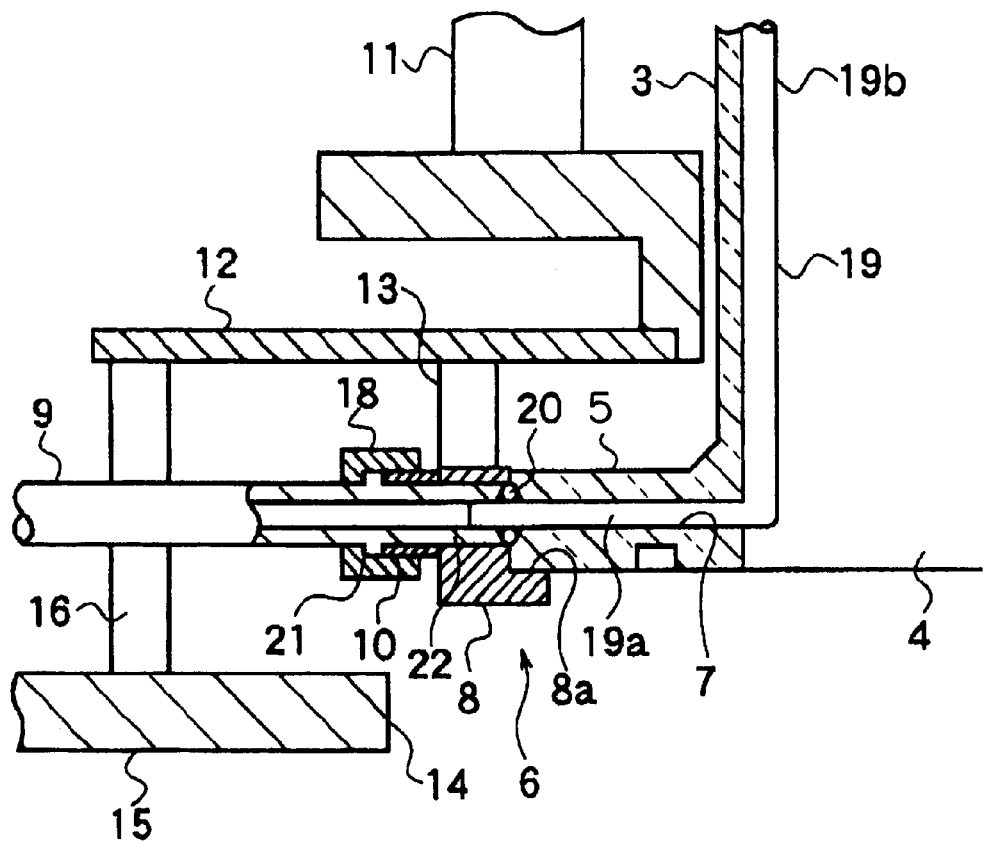
FIG. 2 is an enlarged sectional view of a main part of the vertical thermal processing unit shown in FIG. 1.

An embodiment of the invention will now be described in more detail with reference to FIGS. 1 and 2.

FIG. 1 is a schematic longitudinal sectional view of a vertical thermal processing unit according to an embodiment of the invention. FIG. 2 is an enlarged sectional view of a main part of the vertical thermal processing unit.

As shown in FIG. 1, the vertical thermal processing unit 1 comprises a processing container 3 (processing tube). The processing container 3 can contain a boat 2 as a holding tool, which holds a plurality of objects to be processed, for example 30 to 50 wafers W, in a vertical tier-like manner at a predetermined pitch. Then, the processing container 3 can conduct a predetermined CVD process to the wafers W. The processing container 3 is made of a heat-resistance material such as crystal and has a substantially vertical cylindrical shape. A lower end of the processing container 3 is provided with an opening 4 as a furnace opening. A flange 5 is integrally formed at a peripheral portion of the opening 4. A gas-supplying unit 6 is provided at the flange 5 in order to introduce a process gas or an inert gas such as N2 gas for purging into the processing container 3.

As shown in FIG. 2, the gas-supplying unit 6 has: a gas-supplying hole 7 formed in the flange 5 in a radial direction thereof, a circular supporting frame 8 provided at an outer peripheral portion of the flange 5 and made of a metal such as stainless steel, and a gas-supplying port 10 (fixing mechanism) provided at the circular supporting frame 8 for connecting the gas-supplying hole 7 and a gas-supplying line 9. A thickness of the flange 5 is greater than a conventional one because the gas-supplying hole 7 is formed therein. Actually, in the flange 5, a plurality of gas-supplying holes 7 respectively corresponding to various gasses is formed at a suitable interval in a peripheral direction.

The circular supporting frame 8 surrounds the outer peripheral portion of the flange 5. The circular supporting frame 8 has a supporting part 8a at a lower portion thereof for supporting a lower surface of the outer peripheral portion of the flange 5. The circular supporting frame 8 is attached to a lower surface of a base plate 12 of a heater 11 via a suspending rod 13. The base plate 12 of the heater 11 is attached to an upper surface of a base plate 15 having a central opening 14 via a supporting member 16. In addition, a flange positioner 17 that can fix and position an upper peripheral surface of the flange 5 is disposed at an upper portion of the circular supporting frame 8 by means of fastening means such as a suitable screw.

The same number of the gas-supplying ports 10 as the number of the gas-supplying holes 7 are provided at the circular supporting frame 8 in such a manner that each gas-supplying port 10 communicates with each gas-supplying hole 7 and projects outward in a radial direction. Each gas-supplying line 9 corresponding to each type of gas is connected to each gas-supplying port 10 via a box nut 18. Each gas-supplying line 9 is connected to each gas source via a valve and a flow-rate adjusting mechanism. An L-shaped injector 19 is inserted through each gas-supplying hole 7 in order to supply each gas to the wafers W in the processing container 3. Herein, it is unnecessary that the injector 19 is L-shaped.

A base portion 19a of the injector 19 extends in a horizontal direction. A point portion 19b of the injector 19 stands up vertically. The base portion 19a of the injector 19 is inserted through the gas-supplying hole 7, from an inside of the processing container 3 to a vicinity of the gas-supplying port 10 of the circular supporting frame 8. An O-ring 20, made of for example fluoride rubber, is disposed on the base portion 19a of the injector 19 between the flange 5 and the circular supporting frame 8, in order to seal a gap between them and a gap between them and the injector 19. The box nut 18 is provided above an outer surface of an end portion of the gas-supplying line 9. The box nut 18 is rotatably engaged and positioned by a circular locking element 21 and adapted to be engaged (fastened) with the gas-supplying port 10. An insert portion 22 of the gas-supplying line 9 projects from the circular locking element 21 and the box nut 18 and adapted to come in contact with the O-ring 20 through the gas-supplying port 10.

A substantially conical apex part 3a is formed at an upper end of the processing container 3. A discharging port 23 is formed at a central portion of the apex part 3a for discharging the gas from the processing container 3. The discharging port 23 is connected to a discharging tube of a discharging system, which comprises a vacuum pump that can form a vacuum at a desired level in the processing container 3 and a pressure-controlling mechanism (not shown). The heater 11 surrounds the processing container 3 in order to heat the wafers W in the processing container 3. For example, the heater 11 is formed by resistance heating elements. The base plate 12 is disposed at a lower end portion of the heater 11.

Under the processing container 3, a lid (cap) 24 is arranged in such a manner that the lid 24 is movable in a vertical direction and that it can hermetically close the opening 4 (furnace opening) by coming in contact with the lower end of the flange 5. The lid 24 is made of for example crystal. It is preferable that a cooling plate 25 having a cooling structure is disposed under the lid 24. In order to hermetically seal a gap between opposite contact surfaces of the lid 24 and the flange 5, a sealing structure (a sealing device) is provided, which is described in Japanese Patent Laid-Open Publication No.11-97447. The sealing structure includes: an inner sealing portion 26 wherein inner opposite contact surfaces are finished into mirror finished surfaces to achieve surface-contact seal, an outer sealing portion 27 wherein a circular metal sheet (not shown) is inserted between outer opposite contact surfaces and the metal sheet is stuck by vacuum suction via circular grooves (not shown) formed in the outer opposite contact surfaces, and circular grooves 28 formed between the inner sealing portion 26 and the outer sealing portion 27 and used for vacuum suction in order to maintain the sealing performance of the inner sealing portion 26. The outer sealing portion 27 may be replaced with a common O-ring seal.

A rotatable table 29 is arranged on an upper portion of the lid 24, as a rotatable stage on which the boat 2 is placed at a predetermined height. A rotating mechanism 30 for rotating the table 29 is disposed under the lid 24. The rotatable table 29 has a rotatable prop 31 that stands up from a central portion of the lid 24. The rotating mechanism 30 mainly consists of a motor not shown and a rotation-transmitting part 32 that can transmit a rotating force of the motor to the rotatable table 29. The rotation-transmitting part 32 has a rotatable shaft 33, which is connected to the rotatable prop 31 of the rotatable table 29 in such a manner that the rotating force of the motor may be transmitted from a under side of the lid 24 to an upper side of the lid 24 in a hermetical manner.

In addition, a heat-retention unit 34 is disposed on the lid 24 in order to prevent temperature drop that may be caused by radiation of heat from the furnace opening 4. The heat-retention unit 34 mainly consists of: a plane heater 35 arranged under the rotatable table 29 and formed by a resistance heating element, and a cylindrical supporting member 36 supporting the heater 35 at a predetermined height with respect to an upper surface of the lid 24 and made of crystal. The rotatable prop 31 of the rotatable table 29 loosely passes through a central portion of the heater 35.

Under the processing container 3, an elevating mechanism (not shown) is disposed for moving up and down the lid 24, in order to open and close the opening 4 and in order to load and unload the boat 2 into and from the processing container 3. The elevating mechanism is disposed in a loading area 37 as an operational area. The loading area 37 may be formed into a load-lock structure.

An operation of the above vertical thermal processing unit is explained. At first, the boat 2 on which the wafers W have been placed is placed on the rotatable table 29 on the lid 24 in the loading area 37. Then, the lid 24 is moved up by the elevating mechanism, so that the boat 2 is loaded into the processing container 3 through the opening 4. Then, the opening 4 is hermetically closed by the lid 24. Next, a predetermined pressure or vacuum is formed in the processing container 3 by way of discharging through the discharging port 23. In addition, a predetermined process temperature is given by the heater 11. On the other hand, the rotatable table 29 is rotated, and hence the boat 2 is rotated. Then, the process gas is introduced into the processing container 3 via the gas-supplying unit 6, so that a predetermined thermal process such as a CVD process is started to the wafers W.

After the predetermined thermal process is completed, power of the heater 11 is turned OFF, the introduction of the process gas is stopped, and the inert gas is introduced for purging the processing container 3. Then, the rotation of the rotatable table 29 is stopped, and the lid 24 is moved down so that the opening 4 of the processing container 3 is opened and the boat 2 is unloaded to the loading area 37.

According to the above vertical thermal processing unit 1, since the gas-supplying unit 6 for introducing the process gas into the processing container 3 is provided at the flange 5 of the processing container 3, a height of the unit 1 may be considerably reduced. In addition, strength of the gas-supplying unit 6 may be enhanced, a structure of the processing container 3 may be simplified and process performance of the unit 1 may be improved.

That is, by providing the gas-supplying unit 6 at the flange 5 of the processing container 3, it becomes unnecessary to provide the gas-supplying unit or the manifold at a side wall of the processing container 3. Thus, a height of the processing container 3 and a height of the unit 1 may be reduced. In addition, the structure of the processing container 3 may be simplified, so that the unit 1 may be manufactured and maintained more easily and at smaller cost. Furthermore, since the manifold is not used, there are less cooling portions, so that heating efficiency may be improved. In addition, since there is no restriction of the height of the unit, the pitch of the wafers W on the boat 2 may be enlarged so that the process performance may be improved.

Especially, the gas-supplying unit 6 has: the plurality of gas-supplying holes 7 formed in the flange 5 in the radial directions thereof, the circular supporting frame 8 provided at the outer peripheral portion of the flange 5 and made of the metal, and the gas-supplying ports 10 (fixing mechanism) provided at the circular supporting frame 8 for respectively connecting the gas-supplying holes 7 and the gas-supplying lines 9. Thus, the strength of the gas-supplying unit 6 may be enhanced more. Therefore, even if a valve or the like is attached to the gas-supplying line 9, the gas-supplying unit 6 can bear the load. That is, durability of the gas-supplying unit 6 may be improved.

In addition, the injector 19 is inserted through each gas-supplying hole 7 in order to supply the process gas or the like to the wafers W. Thus, the process gas or the like can be supplied efficiently from the gas-supplying unit 6 of the flange 5 to the wafers W.

This invention is not limited by the above embodiment, but can be modified variously. For example, although it is preferable that the circular supporting frame is provided at the flange of the processing container, the circular supporting frame may be not provided in some cases. In the cases, it is preferable that a gas-supplying unit has a gas-supplying hole formed in the flange in a radial direction thereof, and a gas-supplying port (fixing mechanism) provided at the flange for connecting the gas-supplying hole and a gas-supplying line.

In the above embodiment, the CVD process is explained by way of an example of thermal process. However, one thermal processing unit of the invention can be applied to a CVD process, a diffusion process, an oxidation process, an annealing process and so on. An object to be processed may be a glass substrate, a LCD substrate, or the like, instead of the semiconductor wafer.

What is claimed is:

1. A thermal processing unit comprising:
    a processing container that can contain an object to be processed therein, the processing container having a lower end provided with an opening,
    a lid that can open and close the opening,
    a flange located at the opening having a height and a width dimension that is greater than the height,
    the flange being formed so as to have an interior gas-supplying hole extending in the width dimension,
    a gas-supplying unit provided at the flange for supplying a gas into the processing container, and
    a heating mechanism that can heat the object to be processed contained in the processing container.

2. A thermal processing unit according to claim 1, wherein;
    the gas-supplying unit has a gas-supplying hole that extends from an outer edge of the flange to an inside of the processing container.

3. A thermal processing unit according to claim 2, wherein;
    the processing container has a substantially cylindrical shape,
    the flange has a substantially circular shape, and
    the gas-supplying hole extends in a substantially radial direction of the flange.

4. A thermal processing unit according to claim 2, wherein;
    a gas-supplying tube is inserted through the gas-supplying hole to extend into the processing container.

5. A thermal processing unit according to claim 4, wherein;
    the flange is provided with a fixing mechanism that can fix the gas-supplying tube to the flange.

6. A thermal processing unit according to claim 4, wherein;
   the gas-supplying tube is hermetically connected with a gas-supplying line.

7. A thermal processing unit according to claim 6, wherein;
   a circular supporting frame is provided at a peripheral area of the flange,
   the circular supporting frame has a through hole that extends from an inter edge to an outer edge thereof, and
   the gas-supplying tube passes through the through hole.

8. A thermal processing unit according to claim 7, wherein;
   the circular supporting frame is made of a metal.

9. A thermal processing unit according to claim 7, wherein;
   the circular supporting frame is provided with a fixing mechanism that can fix the gas-supplying tube to the circular supporting frame.

10. A thermal processing unit according to claim 2, wherein;
    a circular supporting frame is provided at a peripheral area of the flange,
    the circular supporting frame has a through hole that extends from an inter edge to an outer edge thereof, and
    the through hole is communicated with the gas-supplying hole.

11. A thermal processing unit according to claim 10, wherein;
    the circular supporting frame is made of a metal.

12. A thermal processing unit according to claim 1, wherein;
    a circular supporting frame is provided at a peripheral area of the flange.

13. A thermal processing unit according to claim 12, wherein;
    the circular supporting frame is made of a metal.

14. A thermal processing unit comprising:
    a processing container that can contain an object to be processed therein, the processing container having a lower end provided with an opening,
    a lid that can open and close the opening,
    a means for connecting a gas-supplying unit to the processing container, and
    a heating mechanism that can heat the object to be processed contained in the processing container.

\* \* \* \* \*